United States Patent [19]

Warner et al.

[11] Patent Number: 4,701,661

[45] Date of Patent: Oct. 20, 1987

[54] PIEZOELECTRIC RESONATORS HAVING A LATERAL FIELD EXCITED SC CUT QUARTZ CRYSTAL ELEMENT

[75] Inventors: Arthur W. Warner, Whippany, N.J.; Bruce Goldfrank, Glen Cove, N.Y.

[73] Assignee: Frequency Electronics, Inc., Mitchel Field, N.Y.

[21] Appl. No.: 738,697

[22] Filed: May 28, 1985

[51] Int. Cl.⁴ .......................................... H01L 41/08
[52] U.S. Cl. ................................. 310/360; 310/361; 310/312
[58] Field of Search ............... 310/360, 361, 365, 312

[56] References Cited

U.S. PATENT DOCUMENTS 3,165,651 12/1959 Bechmann .
3,202,846 4/1963 Ballato et al. .
4,211,947 7/1980 Ikeno et al. ................... 310/360 X
4,375,604 3/1983 Vig ................................ 310/361 X

FOREIGN PATENT DOCUMENTS 5115710 9/1980 Japan ................................. 310/312

OTHER PUBLICATIONS

A. Warner et al., "Low 'g' Sensitivity Crystal Units and Their Testing", Proc. 33rd Ann. Freq. Control Symp., USAERADCOM, Ft. Monmouth, NJ 07703, Jun. 1, 1979, pp. 306–311.
B. Goldfrank et al., "Further Developments on 'SC' Cut Crystals", Proc. 34th Ann. Freq. Control Symp., USAERADCOM, Ft. Monmouth, NJ 07703, May 1980, pp. 183–186.
B. Goldfrank et al., "Update of SC Cut Crystal Resonator Technology", Proc. 35th Ann. Freq. Control Symp., USAERADCOM, Ft. Monmouth, NJ 07703, May 27, 1981, pp. 92–97.
B. Goldfrank et al., "Further Development in SC Cut Crystal Resonator Technology", Proc. 36th Ann. Freq. Control Symp., USAERADCOM, Ft. Monmouth, NJ 07703, Jun. 2, 1982, pp. 208–221.
A. Warner, "Use of Parallel Field Excitation in the Design of Quartz Crystal Units", Proc. 17th Symp. Freq. Control, 1963, pp. 248–266.
E. R. Hatch et al., "Later-Field Excitation of Quartz Plates" Proc. IEEE Ultrasonics Symp., Oct.–Nov. 1983, pp. 512–515.

(List continued on next page.)

Primary Examiner—Peter S. Wong
Assistant Examiner—Emanuel Todd Voeltz
Attorney, Agent, or Firm—Amster, Rothstein & Ebenstein

[57] ABSTRACT

SC cut crystal resonators having lateral field excitation are disclosed. An SC cut quartz crystal blank is a doubly rotated Y cut which has the very valuable characteristic that its resonance frequency is stable while under stress, either from temperature gradients or from shock and vibration. Because of the threefold symmetry of quartz, and since the SC cut is rotated 22 degrees about the Z axis, there is a Y axis only about 8 degrees from the surface of an SC cut plate. A lateral field directed along or near this axis strongly excites the C mode and very weakly excites the B mode, if at all. The electrodes generating the lateral field are placed on the same major surface of an SC cut quartz crystal disc element and shaped to place the strongest field in the center of the disc element. This has been found to strongly couple to the C mode and suppress all other modes including the B mode and satellite C modes. Spectral purity and Q are enhanced thereby. Also, since the electrodes are disposed on only one major surface of the disc, the other major surface is unencumbered and available for frequency adjustment. The angle which the field forms with the Z' axis determines the relative degree of coupling of the B and C modes. At an angle of about +110°, optimal coupling is obtained for the C mode while the B mode is substantially suppressed. At about +160°, optimal suppression of the B mode is obtained while coupling of the C mode remains strong. At about +60°, approximately equal coupling of the B and C modes is obtained.

18 Claims, 7 Drawing Figures

OTHER PUBLICATIONS

Government Contract No. DAAK20-83-C-0418, Aug. 22, 1983, pp. 1 & 6-8.

A. Ballato, et al., "Lateral-Field Excitation of Berlinite", U.S. Army Electronics Technology & Devices Laboratory, Ft. Monmouth, NJ 07703.

R. Bechmann, "Improved High-Precision Quartz Oscillators Using Parallel Field Excitation", Reprint from the Proceedings of the IRE, vol. 48, No. 3, Mar. 1960.

A. Warner, et al., "Fundamental Studies of Aging in Quartz Resonators, published in the IEEE Transactions on Sonics and Ultrasonics, Jun. 1965, pp. 52-59.

Final Report for Contract No. DA-91-591-EUC-1752, "The Stability and Q-Factor of Quartz Crystals Excited by the Parallel Field Technique", May 1, 1961 to Apr. 30, 1963.

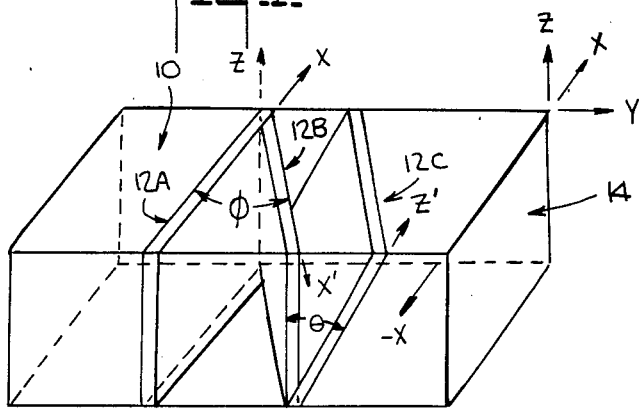
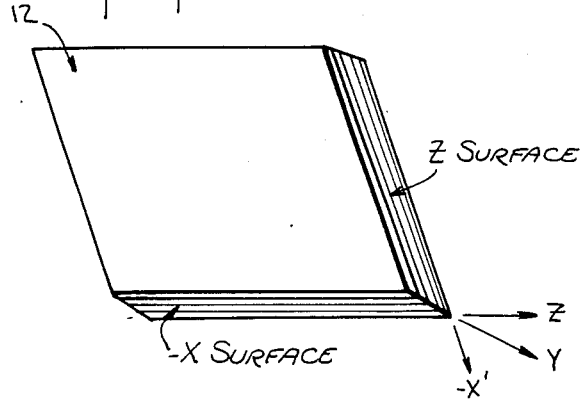
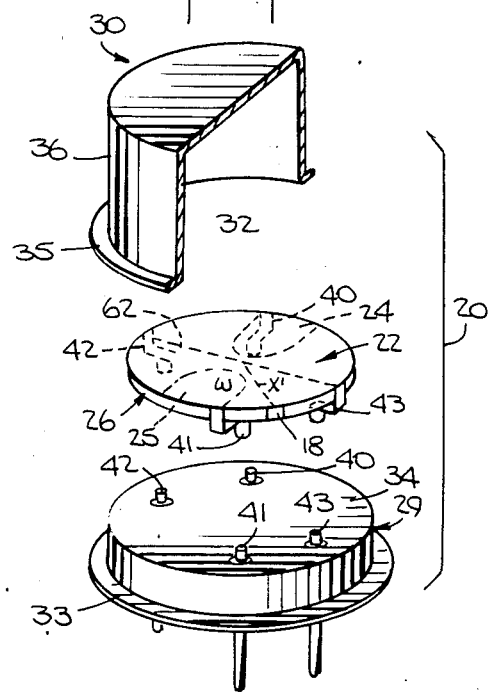
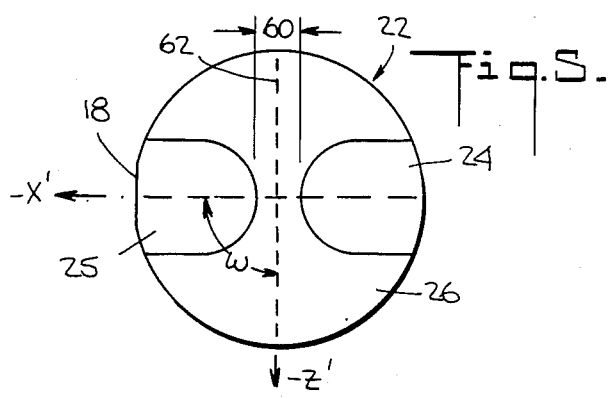
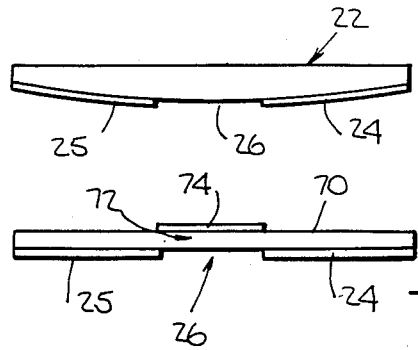
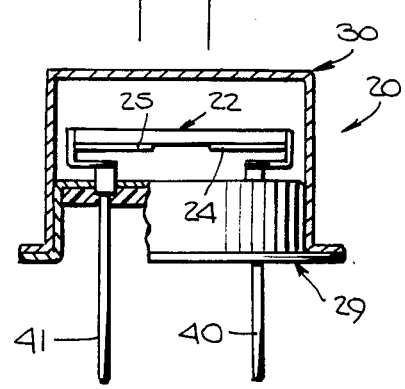

PIEZOELECTRIC RESONATORS HAVING A LATERAL FIELD EXCITED SC CUT QUARTZ CRYSTAL ELEMENT

This invention was made with Government support under Contract No. DAAK20-83-C-0418 awarded by the U.S. Army Electronics Research and Development Command, Fort Monmouth, N.J. 07703. The Government has certain rights in this invention.

BACKGROUND OF THE INVENTION

The present invention relates generally to quartz crystal piezoelectric effect resonators, and particularly to resonators employing a stress compensated ("SC") cut quartz crystal element and methods of operating them.

Recent research has revealed that resonators employing SC cut quartz crystals elements are less affected by a variety of thermally and physically induced stresses than resonators employing other quartz crystal cuts such as an AT cut, for example. See for example, A. Warner, B. Goldfrank, M. Meirs and M. Rosenfeld, "Low 'g' Sensitivity Crystal Units and Their Testing"; Proc. 33rd Ann. Freq. Control Symp., USAERADCOM, Ft. Monmouth, N.J. 07703, June 1, 1979, pp 306–311; B. Goldfrank and A. Warner, "Further Developments on 'SC' Cut Crystals", Proc. 34th Ann. Freq. Control Symp., USAERADCOM, Ft. Monmouth, N.J. 07703, May, 1980, pp 183–186; B. Goldfrank, J. Ho and A. Warner, "Update of SC Cut Crystal Resonator Technology"; Proc. 35th Ann. Freq. Control Symp., USAERADCOM, Ft. Monmouth, N.J. 07703, May 27, 1981, pp 92–97; and B. Goldfrank, J. Tsaclas and A. Warner, "Further Deveopments In SC Cut Crystal Resonator Technology", Proc. 36th Ann. Freq. Control Symp., USAERADCOM, Ft. Monmouth, N.J. 07703, June 2, 1982, pp 208–221. The disclosures of the foregoing documents are incorporated herein by reference.

Heretofore, resonators employing an SC cut quartz crystal element were operated with an electric field exciting the crystal directed normal to a major surface of the crystal element, i.e. along the thickness of the element. Such excitatio has been referred to as "thickness excitation" or "thickness field excitation", and a field directed normal to a major surface of the element can be referred to as a "thickness excitation field" or simply a "thickness field". Since an SC cut quartz crystal element is a "doubly rotated Y cut", an electric field direction normal to the surface of the crystal element has a component in the X as well as the Y direction of the crystal lattice. As a result, both the B mode of vibration (fast shear mode) and the C mode of vibration are strongly coupled, with the frequency of the B mode being within about 9% of that of the C mode. Typically, the C mode of vibration is perferable to the B mode because its frequency of vibration is relatively temperature stable as compared to that of the B mode. Therefore, when utilizing a resonator having an SC cut quartz crystal element in a circuit such as an oscillator operated at the frequency of the C mode of vibration, it was necessary to suppress or filter out by means of a sharply tuned trap, for example, the B mode frequency to prevent it from interferring with the C mode frequency.

There are applications, however, in which the frequency of the B mode of vibration of an SC cut quartz crystal resonator can be useful, for example, as an exact temperature indicator and also as a check on the angular orientation of an SC cut quartz blank. (See the article by A. Warner, et al. titled "Low 'g' Sensitivity Crystal Units And Their Testing" referred to above).

Piezoelectric elements used as resonators are frequently excited by a thickness electric field which is typically generated by placing an electrode on each of the two major surfaces of the piezoelectric element opposite each other. Piezoelectric elements used in resonators have also been excited with an electric field directed parallel to a major surface of the piezoelectric element. Such parallel excitation has been referred to as "parallel field excitation" and more recently as "lateral-field excitation", and a field directed parallel to a major surface of the crystal element can be referred to as a "lateral excitation field" or simply as a "lateral field". Lateral field excitation may be generated by two electrodes disposed on the same major surface of the piezoelectric element or by two electrodes disposed on opposite major surfaces but offset from each other so as to direct the electric field laterally into the piezoelectric element between the two electrodes. Lateral field excitation of piezoelectric crystal elements is disclosed for example in U.S. Pat. No. 3,165,651 of R. H. Bechmann, issued on June 12, 1965, in U.S. Pat. No. 3,202,846 of A. D. Ballato and R. Bechmann, issued on Aug. 24, 1965, and in A. Warner, "Use of Parallel Field Excitation in the Design of Quartz Crystal Units", Proc. 17th Ann. Symp. Freq. Control, 1963, pp 248–266. While resonators employing quartz crystal elements have been operated with lateral fields, they typically utilized an AT cut where the electric field component in the Y direction was only about 50%. Consequently, the impedance was high.

Therefore, while the use of quartz crystal elements in piezoelectric effect resonators provided relatively stable resonant frequencies, there was a problem in suppressing or eliminating frequencies associated with unwanted vibratory modes of the crystal elements.

There is thus a need to selectively control the relative strength of the different vibratory modes of quartz crystal elements utilized as piezoelectric effect resonators.

OBJECTS AND SUMMARY OF THE INVENTION

It is an object of the present invention to improve the performance of piezoelectric crystal resonators.

It is another object of the present invention to improve the performance of resonators employing SC cut quartz crystal elements.

It is another object of the present invention to selectively control the relative strength of coupling of the different modes of vibration of resonators employing SC cut quartz crystal elements.

It is also an object of the present invention to provide resonators employing SC cut quartz crystal elements in which a single mode of vibration is strongly coupled, for example, the principal C mode, and coupling of other modes of vibration is substantially suppressed.

In consideration of the foregoing and other objects in connection with quartz crystal piezoelectric effect resonators, particularly in furtherance of the object to suppress or eliminate the B mode of vibration in quartz crystal elements, the applicants examined SC cut quartz crystal elements and recognized that due to the threefold symmetry of quartz, i.e. three sets of XY axes mutually spaced by 60°, and the fact that an SC cut quartz crystal element is rotated relative to the XY plane about the Z (or Z') axis as described below, there is a Y axis close to a major surface of such an SC cut quartz crystal element. This and other factors such as the relatively high impedance of thickness field excited SC cut crystal elements as compared to thickness field excited AT cut crystal elements, led to the theoretical discovery that a lateral electric field directed along or near this Y axis of an SC cut crystal element could strongly excite the C mode of vibration and very weakly excite the B mode of vibration if at all depending on the angle at which the electric field was directed with respect to the Z' axis. Subsequent expermental work by the applicants under said Contract No. DAAk20-838-C-0418 has confirmed this theoretical discovery and the analysis leading to it.

The results of applicants' expermental work are summarized in reports prepared for the U.S. Army Electronics Research and Developmental Command, Fort Monmouth, N.J. 07703, titled "Development of SC-CUT LATERAL FIELD RESONATORS", "Semi-Annual Report for Period 1, November 1983-Apr. 31, 1984" dated May 1984, and "Second Semi-Annual Report for Period 1 May 1984-Oct. 1, 1984" dated Nov. 5, 1984, both by Bruce Goldfrank, Frequency Electronics, Inc., 55 Charles Lindbergh Blvd., Mitchel Field, N.Y. 11553. Theoretical analyses by others confirm the correctness of the initial theoretical discovery referred to above. See E. R. Hatch and A. Ballato, "Lateral-Field Excitation of Quartz Plates", Proc. IEEE Ultrasonic Symposium, October-November 1983, pp 512–515.

During the course of expermental work performed under said Contract No. DAAK20-83-C-0418, the applicants discovered that simply applying any lateral field to an SC cut quartz crystal element can create unwanted modes. Thus, the applicants concluded that lateral electric field applied to both major surfaces of an SC cut quartz crystal element and so-called composite lateral fields were not satisfactory. The applicants surprisingly and unexpectedly discovered that not only could the relative strengths of coupling of the B and C modes of vibration be controlled by the angle at which a lateral electric field was directed relative to the Z' axis, but also that spectral purity could be enhanced by the manner in which the lateral electric field is generated and applied to the quartz crystal element. The applicants discovered that spectral purity is enhanced by applying a lateral field to only one major surface of an SC cut quartz crystal element, and that the relative coupling of the C and B modes is controlled by the angle such a field makes with the Z' axis. The applicants further discovered that by applying the strongest field to certain parts of the SC cut quartz crystal element, e.g. in the central region for a disc-like element, substantially all modes except the C and B modes are substantially suppressed, particularly satellite C modes, for the different resonant overtones of the crystal. Moreover, the applicants found that applying a lateral electric field to only one major surface of the SC cut quartz crystal element made the opposite major surface available for frequency adjustment.

A piezoelectric effect resonator made in accordance with the present invention which achieves the above and other objects comprises an SC cut generally plate-like quartz crystal element having a Y axis extending close to a major surface of the plate-like element, e.g. at an angle of between about 0 degrees to about 10 degrees with a major surface of the plate-like element, and means for applying an electric exciting field to only one major surface of the SC cut quartz crystal element directed generally parallel to said surface at an angle with the Z' axis selected to control the relative strengths of coupling of the different vibratory modes. For example, the C mode can be strongly coupled and the B mode weakly coupled, or the C and B modes can both be relatively strongly coupled. The electric field applying means is disposed adjacent to said one major surface of the SC cut quartz crystal element so as to apply the electric field laterally to only one major surface of the SC cut quartz crystal element.

An SC cut quartz crystal blank is obtained from a Y quartz bar by doubly rotating a hypothetical reference blank parallel to the XY plane, first about either the X or Z axis and then about a second axis which is a rotated Z or X axis designated an Z' or X' axis, respectively. Thus, after double rotation and regardless of the order of rotation, the SC cut quartz crystal blank has an X' axis rotated by the angle $\phi$ about the Z axis and forming the angle $\phi$ with the XZ plane, and an Z' axis rotated (or tilted) by the angle $\theta$ about the X' axis and forming the angle $\theta$ with the XY plane. Depending on the angles selected for $\phi$ and $\theta$, one Y axis will be within a given number of degrees of a major surface of the SC cut quartz crystal blank, and the electric field is directed laterally of that major surface of a crystal element made from the blank generally parallel to said major surface and at a given angle with the Z' axis depending on the strength of coupling desired of the vibratory modes of the crystal element. This angle which the field forms with the Z' axis is designated herein by omega ("$\omega$").

Thus, an electric field directed generally parallel to said major surface can be used to select the relative strengths of coupling of the different vibratory modes of the crystal element depending on the angle $\omega$ which the field makes with the Z' axis.

For an SC cut quartz crystal element obtained by rotation first about the Z axis by an angle $\phi$ of about 22° and then about the X' axis by an angle $\theta$ of about 34° (or rotation first about the X axis by an angle $\theta$ of about 34° and then about the Z' axis by an angle $\phi$ of about 22°), for coupling of the C mode, the angle $\omega$ which the electric field makes with the Z' axis is preferably in the range of $+110°\pm50°$, with a positive direction being counterclockwise with respect to the plus-on-compression side of the SC cut quartz right-handed crystal element. For optimum suppression of the B mode, the angle $\omega$ is about 160°, for optimum coupling of the C mode with substantial suppression of the B mode, the angle $\omega$ is about 110°, and for approximately balanced coupling of the B and C modes, the angle $\omega$ is about $+60°$. Thus, the angle $\omega$ can be varied in the approximate range of from about $+60°$ to about $+160°$ to select the relative coupling of the B and C modes. Other values of the angle $\omega$ can also be selected for other relative coupling strengths of the different vibratory modes of an SC cut crystal element.

In one embodiment, the electric field applying means comprises at least one set of two electrodes disposed adjacent the same major surface of the plate-like quartz element so as to generate said electric field laterally along the plate-like quartz element without encumbering a frequency active portion of the opposite major surface of the element. Preferably, the electric field applying means is configured and positioned to generate the strongest electric field so as to suppress satellite modes which for a disc-shaped quartz element was found to be the central region thereof. A preferred embodiment of the electric field applying means comprises two electrodes disposed onthe same major surface of a disc-shaped SC cut quartz crystal element with a gap between the electrodes extending diametrically across the disc. The portion of each of the electrodes adjacent the gap has a curved periphery so as to generate the strongest electric field in the central region of the disc.

The frequency of oscillation of the element can be adjusted by adding a non-conducting mass to or removing mass from the unencumbered frequency-active portion of the opposite major surface of the element. By "frequency-active" it is meant that the frequency of oscillation of the element can be changed by adding thereto or removing therefrom relatively small masses.

A method according to the invention of exciting an SC cut plate-like quartz crystal element obtained as described above, comprises the steps of applying an electric field directed generally parallel to only one major surface of the crystal element and selecting the angle $\omega$ which the field makes with the Z axis in accordance with the desired relative strength of coupling of the different vibratory modes of the crystal element.

A method according to the invention of exciting an SC cut plate-like quartz crystal element obtained as described above for optimally coupling the C mode of vibration while substantially suppressing other modes comprises the steps of applying to the plate-like quartz element an electric field directed generally parallel to only one major surface of the element and selecting the angle $\omega$ the field makes with the Z' axis to optimize coupling of the C mode and suppression of the other modes.

As discussed above, the angle $\omega$ which the field makes with the Z' axis can be selected to optimize C mode coupling while suppressing all other modes, to maximally suppress the B mode while strongly coupling the C mode, to couple the C and B modes approximately equally, and to relative couplings of the B and C modes between the foregoing couplings. If desired, the B and C modes can both be relatively strongly coupled and the resonator used as a dual mode oscillator, for example. Also, the C mode can be used to control the frequency of an oscillator and the B mode can be used to indicate temperature changes in the crystal element.

A method according to the invention of exciting an SC cut plate-like quartz crystal element obtained as described above while adjusting the frequency of oscillation of the element comprises the steps of applying an electrical field laterally to only one major surface of the element and leaving the frequency-active portion of the opposite major surface unencumbered, and adding mass to or removing mass from the unencumberd frequency-active portion of the opposite major surface of the element to adjust its frequency of oscillation. Preferably, the electric field is directed relative to the element as described above.

The above and other objects, advantages, features and aspects of the present invention will be more readily apparent from the following description of the preferred embodiments thereof taken with the accompanying drawings and appended claims.

BRIEF DESCRIPTION OF THE DRAWINGS

The present invention is illustrated by way of example and not limitation in the figures of the accompanying drawings in which like references indicate like parts, and in which:

FIG. 1 is a perspective schematic view showing orientation of SC cut quartz crystal hypothetical reference blanks relative to a Y bar of quartz;

FIG. 2 is a perspective view of an SC cut quartz crystal blank;

FIG. 3 is an exploded perspective view of a resonator utilizing an SC cut quartz crystal disc element cut from the crystal blank of FIG. 2;

FIG. 4 is a side sectional view partly broken away of the resonator of FIG. 3;

FIG. 5 is a bottom plane view of the SC cut quartz crystal disc element forming part of the resonator of FIGS. 3 and 4 depicting the shape and position of the electrodes affixed to the same major surface of the disc element;

FIG. 6 is an enlarged radial cross-sectional view of the SC cut quartz crystal disc element which forms part of the resonator of FIGS. 3 and 4; and FIG. 7 is a schematic view of a SC cut quartz crystal disc element having electrodes affixed to the same major surface thereof and a mass disposed on the frequency-active portion of the opposite major surface thereof to adjust the frequency at which a resonator employing the disc element resonates.

DESCRIPTION OF THE PREFERRED EMBODIMENTS

SC cut quartz crystal blanks are typically cut from a Y quartz bar (i.e. the bar is oriented so that its length extends along the Y axis and an SC cut blank is cut transverse to the length of the bar) after doubly rotating a hypothetical reference blank. Referring to FIG. 1, a Y quartz bar 10 is schematically depicted with reference to a rectangular, XYZ coordinate system. An SC cut crystal blank 12 depicted in FIG. 2 is obtained from the Y quartz bar 10 as follows. A hypothetical reference blank 12A having its major surfaces parallel to the XZ plane 14 of the Y quartz bar 10 is rotated about the Z axis by the angle $\phi$ to obtain the hypothetical reference blank 12B. The reference blank 12B has a Z axis which is the same as that of the Y quartz bar 10, and an X' ($-$X') axis which forms the angle $\phi$ with the X axis of the Y quartz bar 10. The SC cut quartz hypothetical reference blank 12C is obtained by rotating the reference blank 12B about the X' ($-$X') axis by the angle $\theta$. The hypothetical reference blank 12C has an X' axis which forms the angle $\theta$ with the YZ plane and a Z' axis which forms the angle $\theta'$ (not shown) with the XY plane. The Y quartz bar is then cut along the hypothetical reference blank 12C to obtain an SC cut quartz blank 12 depicted in FIG. 2. Thus, the SC cut quartz crystal blank 12 is cut along the hypothetical reference blank 12C obtained by doubly rotating the hypothetical reference blank 12A by the angles $\phi$ and $\theta$. It does not matter which rotation is performed first, i.e. the reference blank 12A could be rotated first about the X axis by the angle $\theta$, with that singly rotated reference blank (not shown) having a Z' axis forming the angle $\theta$ with the Z axis, and then about the Z' axis by the angle $\phi$ to obtain the reference blank 12C. The stages of orientation described above follow IEEE Standard on Piezoelectricity (No. 176-1978), YXwlt$\phi\theta\Psi$, where Y and X are crystallographic axes; w is the width, l the length and t the thickness of the crystal blank; $\phi$ is the angle about the width (Z axis) which the reference blank 12A is rotated (typically 22°); $\theta$ is the angle about the length (X' axis) which the reference blank 12B is rotated (typically 34°); and $\Psi$ is the angle about the thickness (Y'' axis (not shown)) which the reference blank 12C is rotated (typically 0°). A positive direction is referenced with respect to the Z' axis as counter-clockwise rotation when viewing the plus-on-compression side of the right-handed quartz element.

Quartz crystal elements as used are typically disc elements fabricated from quartz blanks such as blank 12 in FIG. 2 and finished, although they can have other shapes. Since these disc elements have a circular periphery, a reference indicator is provided so that the orientation of the disc element with respect to the crystal lattice can be determined. Typically, the reference indicator is a flat 18 along the peripheral edge of the disc element. According to the IEEE Standard Nomenclature, the reference indicator 18 is at the angle $\Psi=0$.

As mentioned above, quartz has three-fold symmetry so that there are three sets of XY axes which are mutually spaced by 60°. Thus, after rotating the hypothetical reference blank 12A about the Z axis by an angle $\phi$ of between about 20° and 30°, there will be a Y axis relatively close to, i.e., within about 0° to about 10° of, a major surface of the SC cut blank 12. For example, for an angle $\phi$ of about 22°, a Y axis will intersect a major surface of the SC cut blank 12 at about 8°. As discussed above, an electric field directed generally along such a Y axis can be used to strongly couple to the C mode while substantially suppressing to a controllable degree coupling to the B mode.

An assembled SC cut quartz crystal resonator 20 is depicted in FIGS. 3 and 4. The resonator 20 includes a disc SC cut quartz crystal element 22 cut from the SC cut quartz crystal blank 12 depicted in FIG. 2. A pair of electrodes 24, 25 are disposed on a major surface 26 of the quartz crystal element 22. The quartz crystal element 22 with electrodes 24, 25 is disposed in an evacuated vessel formed by a metallic base 29 and a metallic cap 30 which together form a sealed, internal chamber 32. The base 29 has a flange 33 surrounding a cylindrical portion 34, and the cap 30 has a flange 35 surrounding a cylindrical portio 36. The cap and base are sized so that the cylindrical portion 34 of the base is received in the cylindrical portio 36 of the cap with the flanges 33 and 35 mating so that they can be adhered together to form a seal between the base and the cap. The electrodes 24,25 are connected with leads 40,41 which pass through air-tight openings in the bottom wall of the cylindrical portion 34 of the base 29. The leads are brought out for connection to an external circuit through the base 29 conventionally and in an air-tight manner.

An SC cut quartz crystal element is obtained and assembled into a resonator such as resonator 20 as follows. A hypothetical Sc cut crystal reference blank 12C is oriented as described above and sawed from a Y quartz bar to provide an SC cut crystal blank 12. The blank is shaped and cleaned to obtain a quartz element 22, the quartz element is loaded into a mask holder and the electrodes 24,25 are plated onto the element through the mask in ultra-high vacuum. The base 29 of the resonator is fabricated and the quartz element is attached to the leads which form a support for the quartz element. The desired resonant frequency of the quartz element is adjusted, as described below for example, and the base 29 and cap 30 are sealed in an ultra-high vacuum using cold-weld techniques. All of the foregoing can be carried out by conventional apparatus and processes.

Referring to FIGS. 5-7, embodiments of SC cut quartz elements are depicted in which the applied electric field direction is generally parallel to one Y axis of the quartz crystal element. In the embodiment of FIGS. 5 and 6, electrodes 24,25 are disposed on the same major surface 26 of the quartz crystal element 22. Surface 26 is shown in FIG. 6 to be curved and the disc element 22 is shown exaggerated to illustrate that it has a plano-convex configuration. Other shapes such as bi-convex or bi-planar can also be used for the quartz disc element 22. Electrodes 24,25 generate an electric field which has a direction laterally through the crystal generally parallel to the surface 26 on which the electrodes 24,25 are disposed.

Referring now to FIG. 5, in which the electrodes 24,25 are disposed on the same major surface 26 of the crystal element 22, the reference indicator 18 is a "flat" along the edge of the crystal element, which is normal to the $-X'$ axis, i.e., is parallel to the $-X'$ surface of the SC cut quartz blank 12 in FIG. 2. The electrodes 24,25 are disposed with a gap 60 therebetween having an axis 62 extending between the electrodes 24,25 along a diameter of the disclike quartz element 22. The axis 62 of the gap 60 forms an angle $\omega$ with the X' axis. The flat 18 in the FIG. 5 embodiment extends approximately parallel to the Z' axis, so that the angle formed between a normal to the flat, i.e. the X' axis, and the axis 62 fo the gap corresponds to the angle $\omega$ for the field direction generated by approximately equally sized and similarly shaped, approximately diametrically opposed electrodes. The field direction, using right-hand quartz, can be defined as follows: electrodes having a gap therebetween which has an axis normal to the Z' axis generate a field parallel to the Z' axis. Thus, the angle $\omega$ designated in FIG. 5 with respect to the X' axis and the axis 62 of the gap, and also with respect to the field direction and the Z' axis, is about $+90°$, and a value of $\omega$ of 110° corresponds to a field directio parallel to one Y axis. FIG. 3 shows the axis 62 of the gap between the electrodes 24,25 forming an angle $\omega$ with the X' axis of about 110°, i.e., the gap is rotated about 110° from the flat 18.

Preferably, the strongest electric field is generated centrally in the disc element 22 and the electrodes 24,25 are shaped to provide such a lateral field. A curved peripheral shape, preferably circular, for the electrodes adjacent the central region of the disc element 22 has been found to provide the strongest field in that central region so that only the principal C mode is generated and satellite C modes otherwise generated by a strong field extending laterally through the disc element away from the central region are suppressed.

For an SC cut crystal having the angles $\theta$ and $\phi$ equal to about 34° and about 22°, respectively, the angle $\omega$ can be selected in accordance with the relative degree of coupling desired for the B and C modes. For optimum coupling of the C mode and suppression of the B mode, the value of $\omega$ is in the approximate range of about $+90°$ to about 130°, and preferably about $+110°$. For maximum suppression of the B mode, the value of $\omega$ is about $+160°$ and for approximately equal coupling of the B and C modes, the value of $\omega$ is about $+60°$. Thus, coupling to the C mode increases with a value of $\omega$ from 60° to about 110° where C mode coupling is maximal, then decreases to about 150° where C mode coupling remains substantial; coupling to the B mode decreases with a value of $\omega$ from 60° to about 150° at which the B mode is maximally suppressed. For example, by using a field rotation ω of 60°, the C and B mode resistances and Q's are approximately equal. A field rotation ω of 160° yields a C mode with a higher resistance (hence lower Q) than the 110° field rotation. However, the resistance of the B mode increases with increasing ω by approximately a factor of two. Because of the shaping and positioning of the electrodes 24,25, and their disposition on the same major surface 26 of the quartz element, strong C mode coupling is obtained with exceptional spectral purity essentially without satellite C modes and other modes, and with selectable suppression of the B mode depending on the angle ω.

Referring now to FIG. 7, in the lateral field resonator arrangement of FIGS. 5–6, with the electrodes 24,25 disposed on the same major surface 26 of the disc-like quartz element, the major surface 70 opposite that to which the electrodes 24,25 are adhered is exposed permitting easy adjustment of the frequency of vibration by addition of mass to or removal of mass from the frequency-active region 72 of the element. A non-conducting mass 74 can be added to the quartz element 70 by deposition in ultra-high vacuum, for example, to decrease the frequency of vibration, and mass can be removed by etching or iron milling, for example, from the surface of the disc to increase the frequency of vibration.

Several embodiments of resonators have been constructed and tested. The parameters and test results for a typical SC cut crystal disc element of the type depicted in FIG. 3 are given below.

| | |
|---|---|
| Disc diameter | .550"(13.97 mm) |
| Disc thickness (at center) | .040"(1.016 mm) |
| Disc diopter | 4.125 [5.058"(128.5 mm)] |
| Electrode material | gold |
| Electrode thickness | 400Å ± 100Å |
| Electrode gap width | .075"(1.905 mm) ± .050"(1.27 mm) |
| Radius of electrode ends | .125"(3.175 mm) |
| Width of electrodes | .250"(6.35 mm) |
| Field direction (ω) | 110° |
| C mode frequency (3rd overtone) | 5.0 MHz |
| C mode resistance | 300 ohms |
| B mode frequency (3rd overtone) | 5.43 MHz |
| B mode resistance | 6000 ohms |
| Q | $2 \times 10^6$ |
| Inductance ($L_1$) | 28 henries |
| Capacitance ($C_1$) | $3 \times 10^{-17}$ farads |

With regard to the typical values given above: it has been found that increasing the gap width by small distances increases resistance, with the Q remaining substantially the same; shaping the electrodes has been found to enhance spectral purity; and increasing the thickness of the plated electrodes has been found to increase resistance.

Certain changes and modifications to the embodiments disclosed herein will be apparent to those of skill in the art. It is the applicants' intention to cover by the claims all modifications and changes which can be made to the embodiments chosen herein for purposes of disclosure which do not depart from the spirit and scope of the invention.

What is claimed is:

1. A piezoelectric effect resonator comprising a doubly rotated SC cut plate-like quartz crystal element having an X' axis forming an angle $\phi$ of from about 20° to about 30° with a YZ plane and an angle $\theta$ of from about 33° to about 35° with an XY plane so that a Y axis extends close to a major surface of the quartz crystal element, and means for applying to only said major surface of the plate-like quartz crystal element an electric field having field direction which forms a positive angle with the Z' axis of approximately $+110° \pm 50°$.

2. The resonator according to claim 1 wherein the value of $\theta$ is about 34° and the value of $\phi$ is about 22° so that said Y axis forms an angle of about 8° with said major surface.

3. The resonator according to claim 1 wherein the means for applying the electric field comprises at least two electrodes shaped and disposed relative to said major surface of the plate-like quartz element so as to generate said electric field.

4. The resonator according to claim 1 wherein the electric field applying means comprises at least two electrodes disposed adjacent to said major surface of the plate-like quartz element so as to generate said electric field laterally along the plate-like quartz element.

5. The resonator according to claim 1 wherein the plate-like element is a disc and the electric field applying means is shaped and disposed adjacent to said major surface to generate the strongest electric field generally in the center of the disc.

6. The resonator according to claim 1 including additional mass disposed on a frequency-active portion of the major surface of the plate-like quartz element opposite to said major surface adjacent which the electrodes are disposed for adjusting the resonance frequency of the resonator.

7. The resonator according to claim 1 including a frequency-active region in the major surface of the plate-like quartz element opposite said major surface adjacent which the electrodes are disposed from which mass has been removed for adjusting the resonance frequency of the resonator.

8. A piezoelectric effect resonator comprising an SC cut plate-like quartz crystal element obtained by doubly rotating a hypothetical reference blank situated in a Y quartz bar parallel to the XZ plane of the bar, the element having an X' axis rotated approximately 22° about the Z axis and a Z' axis rotated approximately 34° about the X' axis, and means for applying to only one major surface of the plate-like quartz element an electric field having a field direction generally parallel to said major surface which forms a positive angle with the Z' axis of from about 60° to about 160°.

9. The resonator according to claim 8 wherein the means for applying the electric field comprises two spaced electrodes disposed on said one major surface to generate the strongest electric field in a central region of the plate-like element.

10. The resonator according to claim 9 wherein the electrodes are spaced by a gap and the periphery portion of each electrode adjacent the gap is curved to generate the strongest field in said central region.

11. The resonator according to claim 10 wherein the plate-like quartz crystal element is a disc and the electrodes are positioned so that the gap extends diametrically across the disc.

12. The resonator according to claim 11 including additional mass disposed on a frequency-active portion of the major surface of the plate-like quartz element opposite to said one major surface adjacent which the electrodes are disposed for adjusting the resonance frequency of the resonator.

13. The resonator according to claim 11 including a frequency-active region in the major surface of the plate-like quartz element opposite said one major surface adjacent which the electrodes are disposed from which mass has been removed for adjusting the resonance frequency of the resonator.

14. The resonator according to claim 11 wherein the electrodes are positioned so as to generate a field having a field direction forming an angle of about +110° with the Z' axis.

15. A method of exciting an SC cut plate-like quartz crystal element to oscillate in the C mode while substantially suppressing oscillations in other modes comprising the step of applying to only one major surface of the plate-like quartz element an electric field directed at a positive angle with the Z' axis of about 110°±50°.

16. A method of exciting an SC cut plate-like quartz crystal element obtained by doubly rotating a hypothetical reference blank situated in a Y quartz bar parallel to the XZ plane of the bar, the element having an X' axis rotated approximately 22° about the Z axis and a Z' axis rotated approximately 34° about the X' axis, to oscillate in the C mode while substantially suppressing oscillations in other modes comprising the step of applying to only one major surface of the plate-like quartz element a lateral electric field directed generally parallel to said one major surface at a positive angle with the Z' axis of about 110° to ±50°.

17. The method according to claim 16 wherein an electric field is generated which forms a positive angle with the Z' axis of approximately110°.

18. A method of exciting an SC cut plate-like quartz crystal element obtained by doubly rotating a hypothetical reference blank in a Y quartz bar parallel to the XY plane of the bar, the element having an X' axis forming an angle of about 22° with a YZ plane and a Z' axis forming an angle of about 34° with an XY plane to vibrate in a plurality of modes comprising the steps of applying to only one major surface of the plate-like quartz element a lateral electric field directed at an angle with the Z' axis in the approximate range of from about +60° to about +160°.

* * * * *